(12) United States Patent
Mao et al.

(10) Patent No.: US 11,600,212 B2
(45) Date of Patent: Mar. 7, 2023

(54) FLEXIBLE DISPLAY SCREEN AND ELECTRONIC DEVICE

(71) Applicants: Wuhan BOE Optoelectronics Technology Co., Ltd., Hubei (CN); BOE Technology Group Co., Ltd., Beijing (CN)

(72) Inventors: Dalong Mao, Beijing (CN); Jian Zhao, Beijing (CN); Peng Chen, Beijing (CN); Zizheng Liu, Beijing (CN); Zhuo Chen, Beijing (CN); Dongxu Yuan, Beijing (CN); Hao Yu, Beijing (CN); Man Wang, Beijing (CN)

(73) Assignees: WUHAN BOE OPTOELECTRONICS TECHNOLOGY CO., LTD., Hubei (CN); BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 17/580,227

(22) Filed: Jan. 20, 2022

(65) Prior Publication Data
US 2022/0238053 A1    Jul. 28, 2022

(30) Foreign Application Priority Data
Jan. 22, 2021 (CN) .......................... 202110090713.1

(51) Int. Cl.
*G09G 3/00* (2006.01)
*G09G 3/32* (2016.01)
(Continued)

(52) U.S. Cl.
CPC ............... *G09G 3/035* (2020.08); *G09G 3/32* (2013.01); *H01L 27/3223* (2013.01);
(Continued)

(58) Field of Classification Search
CPC .... G09G 3/035; G09G 3/32; G09G 2360/144; G09G 3/00
See application file for complete search history.

(56) References Cited

U.S. PATENT DOCUMENTS

| | | | | |
|---|---|---|---|---|
| 4,602,342 A | * | 7/1986 | Gottlieb | G01J 3/42 250/338.5 |
| 5,771,068 A | | 6/1998 | Sali et al. | |

(Continued)

FOREIGN PATENT DOCUMENTS

| | | |
|---|---|---|
| CN | 101169567 A | 4/2008 |
| CN | 101191968 A | 6/2008 |

(Continued)

OTHER PUBLICATIONS

CN202110090713.1 first office action.

*Primary Examiner* — Olga V Merkoulova
(74) *Attorney, Agent, or Firm* — IPro, PLLC

(57) ABSTRACT

Provided is a flexible display screen, including: a flexible substrate provided with a foldable portion; pixel units disposed on a first surface of the flexible substrate; and a fold detection device including a reflective grating structure, an optical waveguide structure and a photoelectric sensor, wherein the optical waveguide structure and the reflective grating structure are sequentially laminated on the first surface of the flexible substrate and both disposed in the foldable portion, an orthographic projection of the optical waveguide structure onto the flexible substrate is overlapped with an orthographic projection of the reflective grating structure onto the flexible substrate, and the optical waveguide structure is connected to the photoelectric sensor.

18 Claims, 5 Drawing Sheets

(51) Int. Cl.
  *H01L 27/32* (2006.01)
  *H01L 51/00* (2006.01)
(52) U.S. Cl.
  CPC ...... *H01L 27/3269* (2013.01); *H01L 51/0097* (2013.01); *G09G 2300/0413* (2013.01); *G09G 2360/144* (2013.01); *H01L 2251/5338* (2013.01)

(56) References Cited

U.S. PATENT DOCUMENTS

| | | | | |
|---|---|---|---|---|
| 7,512,294 | B2* | 3/2009 | Wang | G01L 1/246 |
| | | | | 385/13 |
| 9,638,591 | B1* | 5/2017 | Sarcia | G02B 6/02176 |
| 10,712,273 | B2* | 7/2020 | Rothberg | G01N 21/7746 |
| 2007/0258674 | A1* | 11/2007 | Wang | G01D 5/35303 |
| | | | | 385/13 |
| 2008/0100566 | A1 | 5/2008 | Miyasaka et al. | |
| 2008/0122804 | A1* | 5/2008 | Kinoshita | G06F 1/3262 |
| | | | | 345/175 |
| 2010/0103140 | A1* | 4/2010 | Hansson | G06F 3/0421 |
| | | | | 345/175 |
| 2014/0334767 | A1* | 11/2014 | Lim | G06F 3/0421 |
| | | | | 385/13 |
| 2018/0128654 | A1 | 5/2018 | Wang | |
| 2018/0348132 | A1* | 12/2018 | Rothberg | G01N 21/7746 |
| 2021/0013265 | A1* | 1/2021 | Hinata | H01L 27/322 |

FOREIGN PATENT DOCUMENTS

| | | |
|---|---|---|
| CN | 104848798 A | 8/2015 |
| CN | 107044828 A | 8/2017 |
| CN | 108810196 A | 11/2018 |
| JP | 2001110861 A | 4/2001 |
| JP | 2006084188 A | 3/2006 |
| KR | 950033565 A | 12/1995 |

* cited by examiner

FLEXIBLE DISPLAY SCREEN AND ELECTRONIC DEVICE

CROSS-REFERENCE TO RELATED APPLICATION

This application is based on and claims priority to Chinese Patent Application No. 202110090713.1, filed on Jan. 22, 2021, the disclosure of which is herein incorporated by reference in its entirety.

TECHNICAL FIELD

The present disclosure relates to the field of display device technologies, in particular to a flexible display screen and an electronic device.

BACKGROUND

With the development of flexible display screen technologies, the number of electronic devices with foldable screens is gradually increasing. The foldable screen may be folded by the user to form different states, such as a fully folded state, a half-folded state and a flattened state. The electronic device may control the screen to perform corresponding display, such as a full-screen display, a partial-screen display, a display of image zooming or transiting, or the like, according to the different folding states of the foldable screen.

SUMMARY

An object of the present disclosure is to provide a flexible display screen and an electronic device.

In a first aspect, a flexible display screen is provided. The flexible display screen includes:

a flexible substrate provided with a foldable portion;

pixel units disposed on a first surface of the flexible substrate; and a fold detection device including a reflective grating structure, an optical waveguide structure and a photoelectric sensor, wherein the optical waveguide structure and the reflective grating structure are sequentially laminated on the first surface of the flexible substrate and both disposed in the foldable portion, an orthographic projection of the optical waveguide structure onto the flexible substrate is overlapped with an orthographic projection of the reflective grating structure onto the flexible substrate, and the optical waveguide structure is connected to the photoelectric sensor.

In some embodiments, the optical waveguide structure includes an isolation layer, a transparent conductive layer and a passivation layer laminated on the flexible substrate, and the isolation layer and the passivation layer have a smaller refractive index than the transparent conductive layer; and the reflective grating structure is disposed on the passivation layer.

In some embodiments, the isolation layer has a refractive index ranging from 1.1 to 1.3, the transparent conductive layer has a refractive index ranging from 1.5 to 2.1, and the passivation layer has a refractive index ranging from 1.1 to 1.3.

In some embodiments, materials of the isolation layer and the passivation layer include silicon oxide.

In some embodiments, the reflective grating structure includes a plurality of grating grooves disposed on a side, distal from the transparent conductive layer, of the passivation layer, and a transparent conductive material disposed in the grating groove.

In some embodiments, the reflective grating structure has a flat surface on a side distal from the transparent conductive layer.

In some embodiments, materials of the transparent conductive layer include indium tin oxide.

In some embodiments, the optical waveguide structure is configured to transmit yellow light having a wavelength ranging from 580 nm to 610 nm.

In some embodiments, the passivation layer has a protruding structure stretching into the transparent conductive layer, and the protruding structure has an inclined surface at a specified angle to the flexible substrate, the specified angle being greater than 0 degree and less than 90 degrees.

In some embodiments, the fold detection device includes a plurality of the reflective grating structures disposed in the foldable portion, and the plurality of the reflective grating structures is arranged in the foldable portion in ranks along at least two directions.

In some embodiments, the flexible display screen further includes a control chip and a pixel driving circuit connected to the control chip, wherein the pixel driving circuit includes a plurality of wires, an orthographic projection of the reflective grating structure onto the flexible substrate is within an orthographic projection of the wires onto the flexible substrate, and the wires include at least one of a gate line and a data line.

In some embodiments, the flexible display screen further includes a control transistor, and a sub-screen disposed on both sides of the foldable portion, wherein the pixel driving circuit includes a drive controlling line corresponding to the sub-screen, and the control transistor is connected to the drive controlling line and the gate line in the sub-screen corresponding to the drive controlling line, respectively.

In some embodiments, the flexible display screen further includes a control chip disposed on the flexible substrate, and at least one ambient light detection array connected to the control chip, wherein the ambient light detection array includes a plurality of detection transistors, a drain electrode of the detection transistor is connected to the control chip, and the control chip controls display of the flexible display screen in response to drain current of the detection transistor.

In some embodiments, the detection transistor is a low-temperature polycrystalline silicon thin film transistor.

In some embodiments, the flexible display screen includes an addressing thin film transistor for driving the pixel units, wherein the detection transistor shares a common gate electrode and a common source electrode with the addressing thin film transistor.

In some embodiments, the flexible display screen includes a control chip disposed on the flexible substrate, and an infrared light detection device including an infrared emitter and an infrared detection array, wherein the infrared detection array includes a plurality of detection electrodes, the detection electrode includes a metal layer and an electrode film layer disposed on the metal layer; the detection electrode is connected to the control chip; and the control chip controls display of the flexible display screen in response to feedback current of the detection electrode.

In some embodiments, a material of the electrode film layer includes one of lithium niobate and lithium tantalate.

In some embodiments, the infrared emitter is disposed in the foldable portion; and the flexible display screen further includes a dummy pixel region, wherein the infrared detection array of the display screen is disposed in the dummy pixel region.

In some embodiments, the optical waveguide structure includes an isolation layer, a transparent conductive layer and a passivation layer laminated on the flexible substrate; the isolation layer and the passivation layer have a smaller refractive index than the transparent conductive layer; the isolation layer has a refractive index ranging from 1.1 to 1.3, the transparent conductive layer has a refractive index ranging from 1.5 to 2.1, and the passivation layer has a refractive index ranging from 1.1 to 1.3; and materials of the isolation layer and the passivation layer include silicon oxide; and the reflective grating structure is disposed on the passivation layer;

the optical waveguide structure is configured to transmit yellow light having a wavelength ranging from 580 nm to 610 nm; and the passivation layer has a protruding structure stretching into the transparent conductive layer, and the protruding structure has an inclined surface at a specified angle to the flexible substrate, the specified angle being greater than 0 degree and less than 90 degrees.

According to another aspect of the present disclosure, an electronic device is provided. The electronic device includes a flexible display screen, and the flexible display screen includes:

a flexible substrate provided with a foldable portion;

pixel units disposed on a first surface of the flexible substrate; and a fold detection device, including a reflective grating structure, an optical waveguide structure and a photoelectric sensor, wherein the optical waveguide structure and the reflective grating structure are sequentially laminated on the first surface of the flexible substrate and both disposed in the foldable portion, an orthographic projection of the optical waveguide structure onto the flexible substrate is overlapped with an orthographic projection of the reflective grating structure onto the flexible substrate, and the optical waveguide structure is connected to the photoelectric sensor.

BRIEF DESCRIPTION OF THE DRAWINGS

For clearer descriptions of the technical solutions in the embodiments of the present disclosure, the following briefly introduces the accompanying drawings required for describing the embodiments. Apparently, the accompanying drawings in the following description show merely embodiments of the present disclosure, and persons of ordinary skill in the art may still derive other drawings from these accompanying drawings without creative efforts.

DETAILED DESCRIPTION

In order to make the objectives, technical solutions and advantages of embodiments of the present disclosure more clearly, technical solutions of embodiments of the present disclosure will be described clearly and completely below in combination with the accompanying drawings in embodiments of the present disclosure. It is obvious that the described embodiments are only a part of embodiments of the present disclosure, not all embodiments of the present disclosure. All the other embodiments achieved by those of ordinary skills in the art, based on the embodiments of the present disclosure without creative work, shall fall within the protection scope of the present disclosure.

With the development of flexible display screen technologies, the number of electronic devices with foldable screens is gradually increasing. The foldable screen may be folded by the user to form different states, such as a fully folded state, a half-folded state and a flattened state. The electronic device may control the screen to perform corresponding display, such as a full-screen display, a partial-screen display, a display of image zooming or transiting, or the like, according to the different folding states of the foldable screen.

In the process of controlling the display, it is critical to detect the folding state of the foldable screen. In the related art, the folding state of the foldable screen is generally detected by following two fashions. The first fashion is to provide a mounting bracket behind a foldable portion of the foldable screen, and further provide a distance sensor on the mounting bracket to detect the folding state of the foldable screen by the distance sensor. The second fashion is to provide a camera above the foldable portion of the foldable screen, and configure the camera to capture and transmit images to a control terminal when the foldable screen is folded, such that the control terminal determines the folding state of the foldable screen through image analysis.

However, in the aforesaid solution, a distance sensor and a camera are employed to detect changes in the external shape of the foldable screen for further determining the folding state of the foldable screen, which has a poor detection accuracy and sensitivity.

Figure 1:
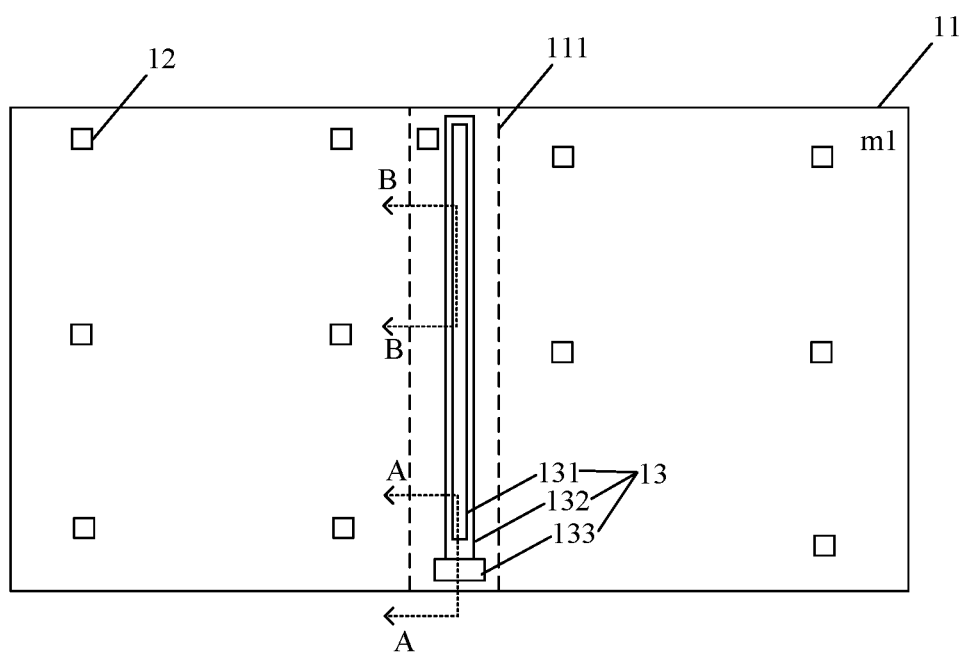
FIG. 1 is a schematic structural diagram of a flexible display screen according to an embodiment of the present disclosure.
Figure 2:
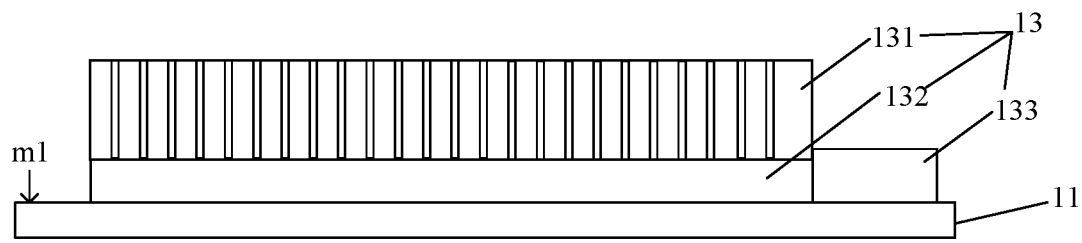
FIG. 2 is a cross-sectional view of the flexible display screen shown in FIG. 1.

FIG. 1 is a top view of a structure of a flexible display screen according to an embodiment of the present disclosure, and FIG. 2 is a cross-sectional view of the flexible display screen shown in FIG. 1 at A-A. The flexible display screen 10 includes a flexible substrate 11, pixel units 12 and a fold detection device 13.

The flexible substrate 11 is provided with a foldable portion 111.

The pixel unit 12 is disposed on a first surface m1 of the flexible substrate 11.

The fold detection device includes a reflective grating structure 131, an optical waveguide structure 132 and a photoelectric sensor 133. The optical waveguide structure and the reflective grating structure are sequentially laminated on the first surface of the flexible substrate and both disposed in the foldable portion, an orthographic projection of the optical waveguide structure onto the flexible substrate is overlapped with an orthographic projection of the reflective grating structure onto the flexible substrate, and the optical waveguide structure is connected to the photoelectric sensor.

It should be noted that the pixel units 12 shown in FIG. 1 are only schematic and do not represent the actual arrangement fashion of the pixel units 12 on the flexible substrate 11. Furthermore, in FIG. 1, the optical waveguide structure 132 is larger than the reflective grating structure 131 to show the laminated reflective grating structure 131 and optical waveguide structure 132, which however is not limited in embodiments of the present disclosure.

In summary, the flexible display screen according to embodiments of the present disclosure is provided with a reflective grating structure, an optical waveguide structure and a photoelectric sensor. The optical waveguide structure directs the light reflected from the reflective grating structure to the photoelectric sensor, and when the foldable portion is folded, the period of the reflective grating structure may be changed, which in turn changes the wavelength of the light reflected by the reflective grating structure. Then, the changes are acquired by the photoelectric sensor, such that the folding state of the flexible display screen can be acquired based on the degree of changes of the wavelength, thereby realizing a high detection accuracy and sensitivity.

Embodiments of the present disclosure provide a flexible display screen, which includes a flexible substrate and pixel units. The flexible substrate is a plate structure capable of being folded and deformed, and may be made of a polymer material such as polyimide (PI), polycarbonate (PC), polyethersulfone (PES), polyethylene terephthalate (PET), polyethylene naphthalate (PEN), polyarylene compound (PAR), or glass fiber reinforced plastic (FRP). A plurality of pixel units is provided on a side of the flexible substrate and arranged in arrays on the flexible substrate to form a pixel array. The pixel unit may be an organic light-emitting diode (OLED), a sub-millimeter light-emitting diode (mini-LED), or a micro light-emitting diode (micro-LED), and this specification is illustrated by taking the OLED pixel unit as an example of the pixel unit.

The flexible display screen is divided into a display region and a non-display region based on the pixel array. The non-display region further includes a dummy pixel region (see FIG. 7) which includes a plurality of dummy pixels. The dummy pixel does not include light-emitting structures or drive transistors and is generally manufactured around the periphery of the display region. By providing the dummy pixel region, the display region can be prevented from being contaminated by some undesirable and impurity ions in the manufacturing process.

Figure 3:
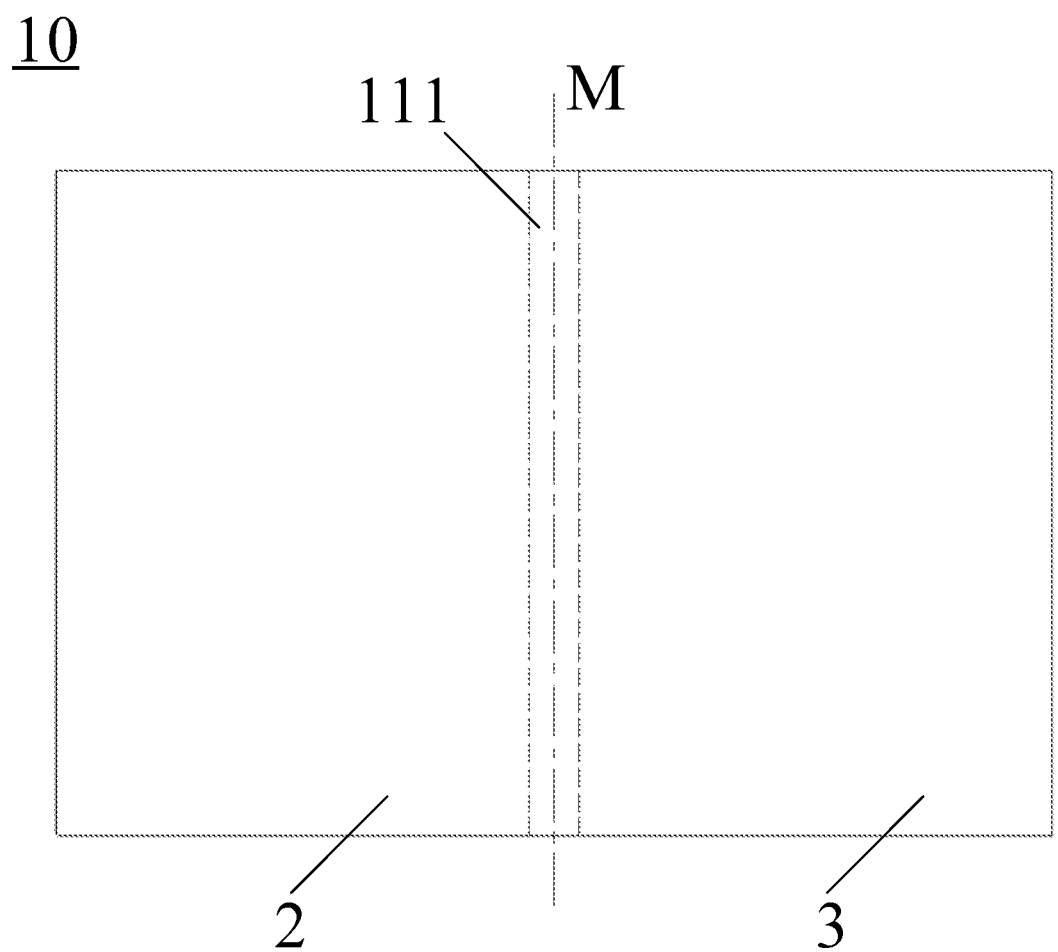
FIG. 3 is a schematic structural diagram of another flexible display screen according to an embodiment of the present disclosure.

FIG. 3 is a schematic structural diagram of another flexible display screen according to an embodiment of the present disclosure. As shown in FIG. 3, the flexible display screen 10 includes a foldable portion 111, and a first sub-screen 2 and a second sub-screen 3 provided on both sides of the foldable portion 111. The foldable portion 111 is a fold-deforming region designed for the flexible display screen 10, and the first sub-screen 2 and the second sub-screen 3 are folded and moved relative to the foldable portion 111.

It should be noted that any position within the screen of the flexible display screen 10 may serve as the foldable portion 111, and the screen portions on both sides of the foldable portion 111 are namely the first sub-screen 2 and the second sub-screen 3. There may be two or more foldable portions 111, which indicates that the flexible display screen 10 may be folded relative to two or more positions. This specification is illustrated by taking an example in which the flexible display screen 10 has only one foldable portion 111 and the foldable portion 111 is disposed at a centerline of the flexible display screen 10.

The flexible display screen 10 has a flattened state, a fully folded state and a half-folded state during the folding movement. When the flexible display screen 10 is in the flattened state, the first sub-screen 2 extends coplanarly and forms an angle of 180 degrees with the second sub-screen 3. When the flexible display screen 10 is in the fully folded state, the first sub-screen 2 is fitted against and forms an angle of 0 degrees with the second sub-screen 3. When the flexible display screen 10 is in the half-folded state, the first sub-screen 2 forms an angle of 0 to 180 degrees with the second sub-screen 3.

The flexible display screen 10 may be folded toward the display side. That is, when the flexible display screen 10 is in the fully folded state, the display sides of the first sub-screen 2 and the second sub-screen 3 are pointing toward each other. The flexible display screen 10 may also be folded toward a side distal from the display side. That is, when the flexible display screen 10 is in the fully folded state, the display sides of the first sub-screen 2 and the second sub-screen 3 are opposite and pointing toward an outer side distal from the other one.

The flexible display screen 10 includes a display control system for controlling the display, and the display control system includes a control chip, a pixel driving circuit, and a fold detection device.

Figure 4:
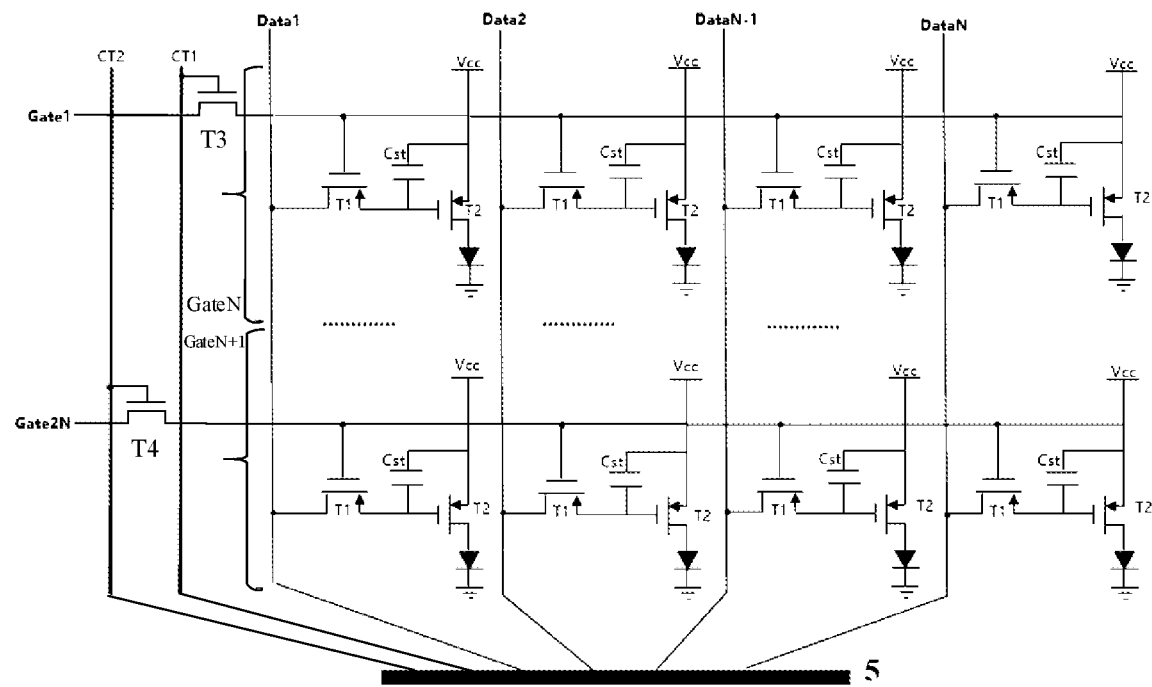
FIG. 4 is a schematic structural diagram of a pixel driving circuit of a flexible display screen according to an embodiment of the present disclosure.

FIG. 4 is a circuit diagram of a pixel driving circuit in a flexible display screen according to an embodiment of the present disclosure. As shown in FIG. 4, the pixel driving circuit includes a plurality of gate lines extending horizontally and a plurality of data lines extending vertically. The gate line includes first gate lines in the first sub-screen and second gate lines in the second sub-screen. There are N first gate lines marked as Gate1-GateN, and N second gate lines marked as GateN+1-Gate2N. There are N data lines marked as Data1-DataN, and the data lines Data1-DataN extend in both the first sub-screen and the second sub-screen. N is a positive integer greater than 2 in this specification.

The pixel driving circuit further includes two drive controlling lines, which are namely a first drive controlling line CT1 provided corresponding to the first sub-screen and a second drive controlling line CT2 provided corresponding to the second sub-screen. The first drive controlling line CT1 is connected to each of the first gate lines Gate1-GateN by a first control transistor T3 provided in correspondence with the first gate lines one by one, which means that the first control transistor T3 is connected to the first drive controlling line CT1 and the first gate lines Gate1-GateN, respectively.

The second drive controlling line CT2 is connected to each of the second gate lines GateN+1-Gate2N by a second control transistor T4 provided in correspondence with the second gate lines one by one, which means that the second control transistor T4 is connected to the second drive controlling line CT2 and the second gate lines GateN+1-Gate2N, respectively.

In the aforesaid pixel driving circuit, the flexible display screen may be quickly and accurately controlled by two drive controlling lines for achieving the split-screen display, and the flexible display screen is controlled to perform the split-screen display by the pixel driving circuit in the following principle.

When the flexible display screen needs a full-screen display, and namely when the first sub-screen and the second sub-screen are both required to perform the display, the first drive controlling line CT1 and the second drive controlling line CT2 output high levels, each of the first control transistor T3 and second control transistor T4 is turned on, the gate lines are sequentially scanned from Gate1 to Gate2N, and the data lines are sequentially from Data1 to DataN.

When only the first sub-screen is required to perform the display, the first drive controlling line CT1 outputs a high level, the second drive controlling line CT2 outputs a low level, all the first control transistors T3 are turned on, all the second control transistors T4 are turned off, the first gate lines are sequentially scanned from Gate1 to GateN, and the data lines are sequentially scanned from Data1 to DataN.

When only the second sub-screen is required to perform the display, the first drive controlling line CT1 outputs a low level, the second drive controlling line CT2 outputs a high level, all the first control transistors T3 are turned off, all the second control transistors T4 are turned on, the second gate lines are sequentially scanned from GateN+1 to Gate2N, and the data lines are sequentially scanned from Data1 to DataN.

When the flexible display screen needs to close the display completely, the first drive controlling line CT1 and the second drive controlling line CT2 both output low levels, all the first control transistors T3 are turned off, and all the second control transistors T4 are turned off.

The pixel driving circuit and the fold detection device are connected to the control chip 5. The fold detection device is configured to detect the folding state of the flexible display screen, and the control chip 5 receives the detection result of the fold detection device and controls, via the pixel driving circuit, the flexible display screen to perform the split-screen display based on the detection result.

The control chip may perform other display controls based on the detection result of the fold detection device, and may for example control the flexible display screen to display by areas, and to flip, zoom or transit the display images. This specification is illustrated by merely taking the split-screen display as an example, and those skilled in the art may extend to other display controls on the basis of this inventive concept, which will not be detailed in this specification.

Figure 5:
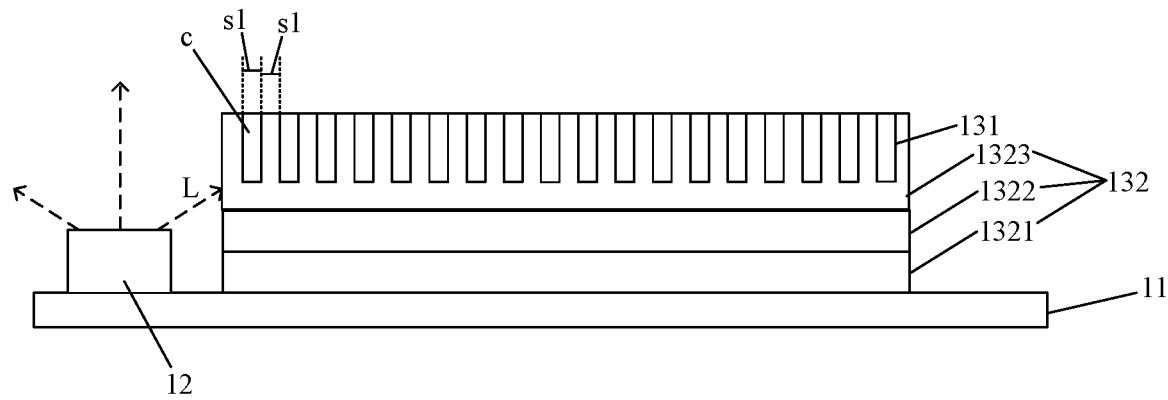
FIG. 5 is a schematic structural diagram of a reflective grating structure and an optical waveguide structure in a fold detection device according to an embodiment of the present disclosure.

The fold detection device includes a reflective grating structure, an optical waveguide structure and a photoelectric sensor. FIG. 5 is a schematic structural diagram of the reflective grating structure 131 and the optical waveguide structure in the fold detection device according to an embodiment of the present disclosure. As shown in FIG. 5, the optical waveguide structure is of a three-film layer structure that includes an isolation layer 1321, an indium tin oxide (ITO) layer 1322, and a passivation (PVX) layer 1323 laminated on a side of the flexible substrate 11. The isolation layer 1321 herein is made of silicon oxide $SiO_2$ deposited on the flexible substrate 11, the transparent conductive layer 1322 (the material of which may include ITO) is provided on a side, distal from the flexible substrate 11, of the isolation layer 1321, and the passivation layer 1323 is disposed on a side, distal from the isolation layer 1321, of the transparent conductive layer 1322. The passivation layer 1323 is typically made of the same material as the isolation layer 1321, which means that the silicon oxide $SiO_2$ is selected.

The optical waveguide structure is disposed on a side of the OLED pixel unit, and the incident light L emitted from the OLED pixel unit 12 may be directed from the end surface of the optical waveguide structure. The isolation layer 1321 has a refractive index of about 1.1-1.3, the passivation layer 1323 has a refractive index of about 1.1-1.3, and the transparent conductive layer 1322 has a refractive index of about 1.5-2.1. In other words, in the three-film layer structure, the middle film layer (transparent conductive layer 1322) has a greater refractive index than the top and bottom film layers (isolation layer 1321 and passivation layer 1323). Under this design, when the incident light from the OLED light-emitting unit is directed from the end surface of the optical waveguide structure, the refractive index difference between the three film layers may compress the incident light into the middle transparent conductive layer 1322 having the greatest refractive index for transmission, such that the light loss can be reduced by compressing the incident light into the transparent conductive layer 1322 for transmission.

The reflective grating structure 131 is disposed on a side, distal from the transparent conductive layer 1322, of the passivation layer 1323 and includes a plurality of grating grooves c spaced uniformly along the same direction and a transparent conductive material (which may include ITO) disposed in the grating grooves c. The arrangement direction of the grating grooves c is defined as a grating extending direction. The width of the grating groove c in the grating extending direction is s1, the distance between adjacent grating grooves c in the grating extending direction is also s1, and the grating period length of the reflective grating structure 131 is 2s1. The grating groove c may be formed by etching the passivation layer 1323.

The incident light generated by the OLED light-emitting unit is directed into the reflective grating structure 131 via the optical waveguide structure. The reflective grating structure 131 may filter the incident light and generate reflected light with a constant wavelength. The reflected light is transmitted in the optical waveguide structure and, by the same token, may also be compressed in the transparent conductive layer 1322 of the optical waveguide structure.

In the reflective grating structure 131, the wavelength of the reflected light is linearly related to the grating period length of the reflective grating structure 131 and the effective refractive index of the reflective grating structure 131, as shown in the following equation (1):

$$\lambda = 2nL \quad (1).$$

In equation (1), λ refers to the wavelength of the reflected light, n refers to the effective refractive index of the reflective grating structure, and L refers to the grating period length of the reflective grating structure 131.

When the flexible display screen 10 is folded, the foldable portion 111 is deformed and the reflective grating structure 131 provided in the foldable portion 111 is also deformed. Then, the grating period length may change due to the deformation of the reflective grating structure 131, which in turn causes changes to the wavelength of the reflected light. As shown in the following equation (2):

$$\Delta\lambda = 2*n*\Delta L \quad (2).$$

In equation (2), Δλ refers to the amount of changes in wavelength of the reflected light, and ΔL refers to the amount of changes in the grating period length of the reflective grating structure 131.

Based on equation (2), it may be seen that the amount of changes ΔL in the grating period length is linearly related to the amount of changes Δλ in wavelength of the reflected light. Therefore, the amount of changes in the grating period length of the reflective grating structure 131 may be deduced by detecting the amount of changes in wavelength of the reflected light, and the folding degree of the flexible display screen 10 may be acquired based on the amount of changes in the grating period length.

In combination with the analysis of the filtering principle of the reflective grating structure 131, it may be seen that the reflective grating structure 131 shall be provided in the foldable portion 111, and the grating extending direction of the reflective grating structure 131 is not co-linear with a folding axis M of the foldable portion 111 shown in FIG. 3. The folding axis M herein of the foldable portion 111 refers to an axis around which the foldable portion 111 is deformed, and the axis is perpendicular to the folding direction of the foldable portion 111.

In order to more effectively establish the correlation between the deformation of the foldable portion and the amount of changes in the grating period length, the grating extending direction shall be perpendicular to the folding axis M of the foldable portion 111. For example, in this embodiment, the folding direction of the flexible display screen 10 is parallel to the extending direction of the gate line, the folding axis M is parallel to the extending direction of the data line, and the grating arrangement direction of the reflective grating structure 131 is perpendicular to the folding axis M.

In the fold detection device, the optical waveguide structure extends to the photoelectric sensor and directs the reflected light to the photoelectric sensor. The photoelectric sensor is a miniature photoelectric sensor provided in the flexible display screen and is connected to the control chip for detecting the wavelength of the reflected light. The photoelectric sensor may output the detection result to the control chip, and the control chip may determine the folding state of the flexible display screen based on the detection result as received and thereby control the display according to the folding state.

In the flexible display screen according to the present disclosure, based on the principle that the reflective grating structure filters the incident light generated by the pixel unit, the photoelectric sensor in the fold detection device may detect the wavelength of the reflected light of the reflective grating structure, such that the control chip can determine the folding state of the flexible display screen based on the detection result of the photoelectric sensor. Compared with the solutions of providing external distance sensors, cameras or other detection devices in the prior art, the flexible display screen according to embodiments of the present disclosure is provided with a fold detection device within the screen, which is conducive to simplifying the structure and reducing the cost. Moreover, since the wavelength of reflected light is linearly related to the deformation of the reflective grating structure, the detection as performed by the wavelength of the reflected light has a high detection accuracy and sensitivity.

In some embodiments, the control chip controls the split-screen display of the flexible display screen via the pixel driving circuit based on the detection result of the fold detection device, which is more intelligent and precise than the prior art. In addition, the pixel driving circuit includes drive controlling lines provided in the corresponding split-screen, and the drive controlling lines may be adopted to quickly and accurately control the flexible display screen to perform the split-screen display.

The optical waveguide structure is of the three-film layer structure as described in the aforesaid embodiments, and thereby may be co-manufactured with the drive transistor in the flexible display screen, which requires no additional process steps and has a higher production efficiency. The passivation layer 1323 is covered with a layer of transparent conductive material (such as ITO) when the drive transistor is manufactured. Thus, the layer of transparent conductive material may cover the fold detection device while being deposited and may be deposited into the grating groove of the reflective grating structure 131. The remaining portion of the transparent conductive material above the reflective grating structure 131 may be etched away to form a reflective grating structure 131 with a flat surface, and the reflective grating structure 131 with the flat surface may perform the filtering more uniformly.

In the fold detection device manufactured by the aforesaid method, the grating groove is filled with the transparent conductive material, and the filled reflective grating structure 131 has a flat surface on a side distal from the optical waveguide structure.

Figure 6:
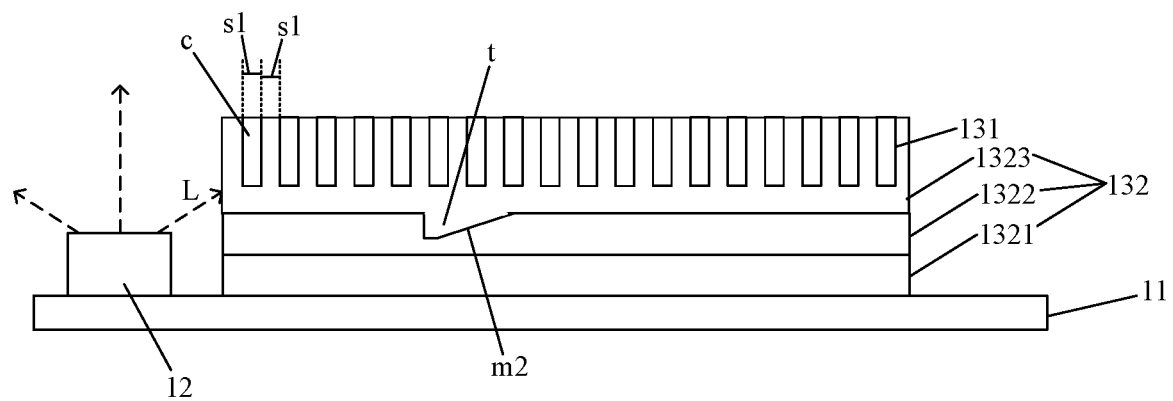
FIG. 6 is a schematic structural diagram of a reflective grating structure and an optical waveguide structure in a fold detection device according to another embodiment of the present disclosure.

In the aforesaid embodiment, the incident light is generated by the OLED pixel unit, and is directed from the OLED pixel unit to the cross-section of the film layer of the optical waveguide structure. However, the amount of light entering into the film layer for transmission is relatively small. In view of this, a reference is made to FIG. 6 which is a schematic structural diagram of another flexible display screen according to an embodiment of the present disclosure. An inclined surface may be formed by anisotropically etching the transparent conductive layer 1322, and the passivation layer 1323 manufactured on the transparent conductive layer 1322 has a protrusion t (e.g., a wedge-shaped protrusion) that stretches into the transparent conductive layer 1322. The protrusion has an inclined surface m2 which is at a specified angle to the flexible substrate screen, with the specified angle being greater than 0 degree and less than 90 degrees. The inclined surface m2 may prevent the light beam directed to the transparent conductive layer 1322 from being failed to be transmitted in the transparent conductive layer 1322 as caused by the small incident angle, which enhances the amount of light entering into the transparent conductive layer 1322 and thereby improves the detection effect.

Figure 7:
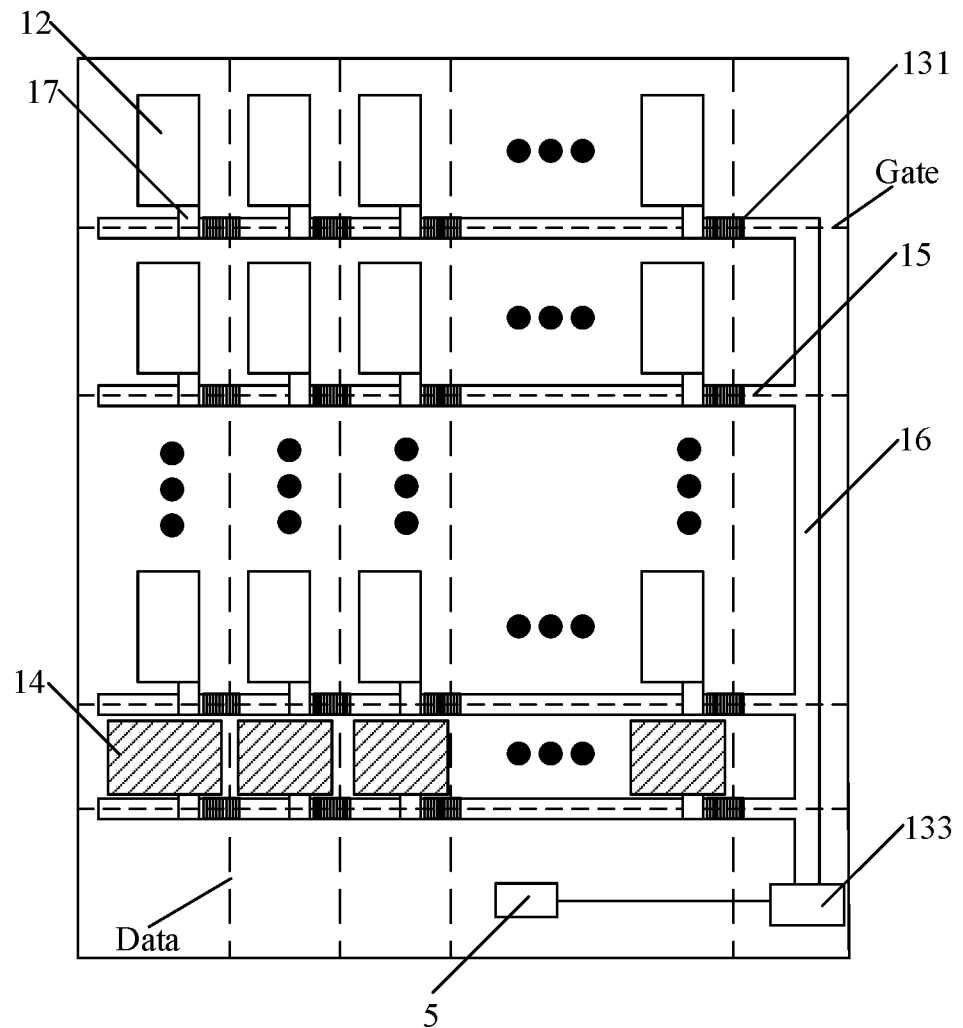
FIG. 7 is a schematic diagram of wiring of a fold detection device according to an embodiment of the present disclosure.

FIG. 7 is a schematic diagram of the wiring of the fold detection device according to an embodiment of the present disclosure. As shown in FIG. 7, the fold detection device includes a plurality of reflective grating structures 131, all of which are arranged in a direction parallel to the folding direction of the flexible display screen, i.e., the extending direction of the gate line in the figure. A plurality of reflective grating structures 131 is distributed in multiple rows and columns at respective positions of the foldable portion 111 along the two directions of the gate and data lines. By providing a plurality of reflective grating structures 131 at respective positions of the foldable portion 111, the fold detection device can achieve a more comprehensive detection of the folding state, which improves the detection accuracy in the folding state of the flexible display screen 10.

In an exemplary embodiment, the pixel driving circuit includes a plurality of wires. An orthographic projection of the reflective grating structure onto the flexible substrate is disposed in an orthographic projection of the conductive wire onto the flexible substrate, and the conductive wire includes at least one of gate line and data line. As a result, the reflective grating structure may be prevented from affecting the opening rate of the flexible display screen, which can save the internal space of the flexible display screen.

Referring to FIG. 7, the optical waveguide structure includes a first transmitting portion 15 and a second transmitting portion 16. The first transmitting portion 15 extends along the gate line and is provided above the gate line, and the reflective grating structure 131 is provided in the first transmitting portion 15. That is, the first transmitting portion 15 and the reflective grating structure 131 are both provided above the gate line, which can reasonably utilize the internal space of the screen without affecting the opening rate of the flexible display screen.

The drive transistor 17 of the OLED pixel unit 12 is also disposed above the gate line, and the reflective grating structure 131 is disposed on a side of the drive transistor 17. An end of the first transmitting portion 15 extends to the outer periphery of the display region and is connected to the second transmitting portion 16 at the outer periphery of the display region. The second transmitting portion 16 extends at the outer periphery of the display region in a direction parallel to the data line and extends to the photoelectric sensor 133 in the non-display region.

In the flexible display screen according to the present disclosure, the fold detection device detects the folding state based on the detection as performed on the light from the OLED pixel unit. In order to prevent the external light source from affecting the detection accuracy, the fold detection device is further provided with a light-shielding layer. The light-shielding layer is manufactured by coating and lithography on a side, distal from the transparent conductive layer 1322, of the passivation layer 1323, and thus blocks the reflective grating structure 131 to thereby shield the external light source from entering the reflective grating structure 131, such that the design purpose of allowing only the incident light from the OLED pixel unit on one side to enter the reflective grating structure 131 can be achieved. Since the light-shielding layer is disposed on the outer side of the reflective grating structure 131 and does not shield the light emitted by the OLED pixel unit in the display region, the light-shielding layer has no influence on the opening rate of the flexible display screen.

In addition, compared with the light emitted by the OLED pixel unit, the natural light has a rather week yellow light energy close to 600 nm. Thus, the reflective grating structure 131 may determine the folding state of the flexible display screen 10 by detecting the yellow light at about 600 nm. In view of this, in a possible embodiment, the isolation layer 1321, the transparent conductive layer 1322 and the passivation layer 1323 in the optical waveguide structure are manufactured to have a predetermined refractive index. For example, the isolation layer 1321 may have a refractive index of 1.1 to 1.3, the transparent conductive layer 1322 may have a refractive index of 1.5 to 2.1, and the passivation layer 1323 may have a refractive index of 1.1 to 1.3, such that the optical waveguide structure is configured to transmit the yellow light having a wavelength ranging from 580 nm to 610 nm and for example merely transmits the yellow light having a wavelength close to 600 nm. The fixed refractive index of each film layer may be achieved by controlling the corresponding film thickness. The refractive index as designed may be input into a simulating software to simulate the film thickness value, and then the corresponding film layer may be manufactured by depositing based on the film thickness value.

The aforesaid embodiments are illustrated by taking an example in which the optical waveguide structure is of a three-layer film structure and the reflective grating structure is provided on the passivation layer. However, embodiments of the present disclosure are not limited thereto. For example, in some embodiments, the optical waveguide structure may be of a single film layer structure, a double film layer structure, or even a multi-layer structure; and the reflective grating structure may be provided on the optical waveguide structure, or may be a structure independent of the optical waveguide structure.

The flexible display screen according to embodiments of the present disclosure may further include at least one row of ambient light detection arrays, and each row of the ambient light detection arrays includes a plurality of low-temperature polycrystalline silicon thin film detection transistors (LTPS-TFT) connected to the drain electrodes, the LTPS-TFT being the detection transistors of the ambient light detection arrays. The LTPS-TFT is featured in having a large light leakage current, and the leakage current in the ambient light detection array may be changed due to the influence of the external ambient light. Thus, the brightness of the external ambient light may be acquired by detecting the magnitude of the leakage current of the ambient light detection array. The sensitivity of such detecting method depends on the collection period of the leakage current, and in some exemplary embodiments, one frame may be taken as the time unit of the collection period, which is more sensitive than the common ambient light sensor.

To reduce the influence of the ambient light detection device on the display of the flexible display screen, the ambient light detection array may be provided in the folding region or alternatively in the dummy pixel region which may be referred to the dummy pixel region 14 shown in FIG. 7.

In a possible embodiment, the LTPS-TFT in the ambient light detection array shares a common gate electrode and a common source electrode with the addressing thin film transistor driving the OLED light-emitting structure, which is conducive to driving the operation of the ambient light detection array.

Based on the aforesaid contents, it may be seen that the flexible display screen according to embodiments of the present disclosure employs LTPS-TFT within the screen to replace the traditional ambient light sensor, which can reduce the wiring space and cost and help to realize a full-screen design. In addition, the detection is more sensitive and accurate.

Figure 8:
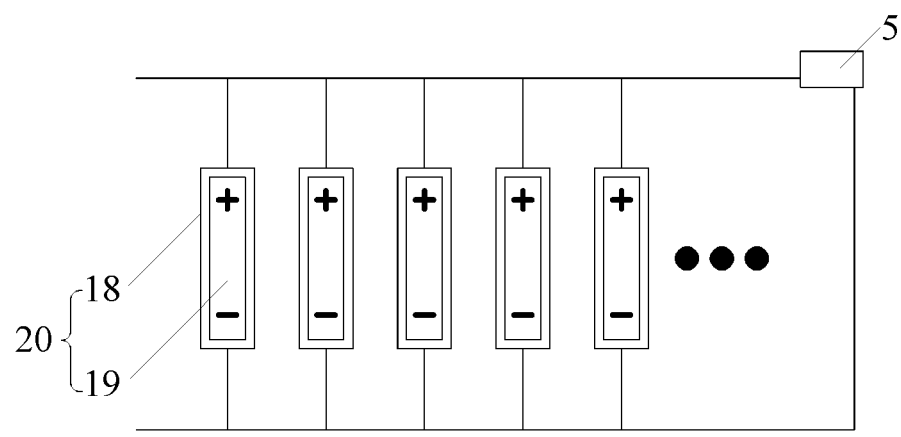
FIG. 8 is a schematic structural diagram of an infrared detection array according to an embodiment of the present disclosure.

The flexible display screen according to embodiments of the present disclosure further includes an infrared light detection device, and the infrared light detection device includes an infrared emitter and an infrared detection array on the flexible substrate. FIG. 8 is a schematic structural diagram of an infrared detection array according to an embodiment of the present disclosure. As shown in FIG. 8, the infrared detection array includes a plurality of detection electrodes 20, and the positive and negative terminals of the detection electrodes 20 are connected to the control chip 5 via a connection line. The detection electrode 20 includes a metal layer 18 and an electrode film layer 19 provided on the metal layer 18, and the electrode film layer 19 is a lithium niobate ($LiNbO_3$) or lithium tantalate ($LiTaO_3$) film layer.

The infrared emitter is placed below the folding region of the flexible display screen, and the infrared detection array is manufactured in the dummy pixel region which may be referred to the dummy pixel region 14 in FIG. 7.

The infrared emitter in use may emit infrared light to the front of the flexible display screen. If there is human skin in front, the infrared light may be reflected back to the flexible display screen, and the detection electrode 20 in the infrared detection array may have a change in electric polarity under the irradiation of the infrared light, and thereby generate a feedback current. Thus, when the control chip 5 detects the presence of a feedback current, it indicates the presence of the infrared reflected light. Based on this, the control chip 5 may control the flexible display screen to perform a corresponding display operation, such as an operation of closing the display. If the control chip does not detect the feedback current, it indicates the absence of the infrared reflected light.

Based on the aforesaid contents, it may be seen that the infrared emitter and the infrared detection array are employed to replace the infrared distance sensor in the prior art, and the infrared detection array is integrated in the flexible display screen. Thus, the in-screen circuit is adopted to control the sensor, which can save the wiring space around the screen and the cost, thereby helping to realize the full-screen design.

Embodiments of the present disclosure further provide an electronic device that includes the flexible display screen according to the aforesaid embodiments. The electronic device may be a cell phone, a foldable watch, a foldable tablet, or the like.

Embodiments of the present disclosure provide another flexible display screen including a flexible substrate, pixel units and a fold detection device. The pixel units are provided on the flexible substrate.

The fold detection device includes a grating structure (which is equivalent to a reflective grating structure mentioned above), an optical waveguide transmitting layer (which is equivalent to an optical waveguide structure mentioned above) and a photoelectric sensor. The grating structure is provided in the foldable portion of the flexible display screen and is disposed on a side of the pixel units. The grating structure generates reflected light corresponding to incident light directed from the pixel unit into the grating structure. The fold-deformation of the foldable portion drives the grating period length of the grating structure to change, so as to change the wavelength of the reflected light.

The optical waveguide transmitting layer is provided between the grating structure and the photoelectric sensor to direct the reflected light to the photoelectric sensor.

In the flexible display screen according to embodiments of the present disclosure, based on the principle that the grating structure filters the incident light generated by the pixel unit, the photoelectric sensor in the fold detection device detects the wavelength of the reflected light of the grating structure, such that the control chip can determine the folding state of the flexible display screen based on the detection result of the photoelectric sensor. Compared with the solutions of providing external distance sensors, cameras or other detection devices in the prior art, the flexible display screen according to embodiments of the present disclosure is provided with a fold detection device within the screen, which is conducive to simplifying the structure and reducing the cost. Moreover, since the wavelength of reflected light is linearly related to the deformation of the grating structure, the detection as performed by the wavelength of the reflected light has a high detection accuracy and sensitivity.

In a possible embodiment, the optical waveguide transmitting layer includes an isolation layer, an ITO layer and a passivation layer laminated on the flexible substrate.

In a possible embodiment, the grating structure is provided on a side, distal from the ITO layer, of the passivation layer, the grating structure includes grating grooves uniformly spaced along the grating arrangement direction, the grating grooves are filled with ITO, and the filled grating structure has a flat surface on a side distal from the ITO layer.

In a possible embodiment, the passivation layer has a wedge-shaped protrusion (which is equivalent to a protruding structure mentioned above) stretching into the ITO layer.

In a possible embodiment, the fold detection device includes a plurality of grating structures provided in the foldable portion, and all the grating structures are arranged in ranks at different positions of the foldable portion along different directions.

In a possible embodiment, the flexible display screen includes a control chip and a pixel driving circuit connected to the control chip. The pixel driving circuit includes a plurality of gate lines extending horizontally and a plurality of data lines extending vertically, and the grating structure is provided above the gate lines and/or the gate lines.

In a possible embodiment, the flexible display screen includes a sub-screen on both sides of the foldable portion. The pixel driving circuit includes a drive controlling line provided corresponding to the sub-screen, and a control transistor is provided between the drive controlling line and the gate line in the corresponding sub-screen.

In a possible embodiment, the flexible display screen includes a control chip and at least one ambient light detection array connected to the control chip. The ambient light detection array includes a plurality of detection transistors that are low-temperature polysilicon thin film transistors, and a drain electrode of the detection transistor is connected to the control chip, such that the control chip controls display of the flexible display screen in response to the drain current of the detection transistor.

In a possible embodiment, the flexible display screen includes an addressing thin film transistor for driving the pixel unit, and the detection transistor shares a common gate electrode and a common source electrode with the addressing thin film transistor.

In a possible embodiment, the flexible display screen includes a control chip and an infrared light detection device that includes an infrared emitter and an infrared detection array. The infrared detection array includes a plurality of detection electrodes that includes a metal layer and an $LiNbO_3$ or $LiTaO_3$ film layer disposed on the metal layer; a positive electrode of the detection electrode is connected to the control chip; and the control chip controls display of the flexible display screen in response to the feedback current of the detection electrode.

In a possible embodiment, the infrared emitter is provided in the foldable portion and the infrared detection array is provided in the dummy pixel region.

In a second aspect, embodiments of the present disclosure provide an electronic device that includes the flexible display screen according to embodiments of the first aspect. The electronic device employs the flexible display screen according to the aforesaid embodiments and thereby has the same technical effect as the flexible display screen, which will not be described here.

In the description of embodiments of the present disclosure, it should be understood that, orientation or position relationships indicated by the terms "center", "upper", "lower", "left", "right", "vertical", "horizontal", "inner", "outer", etc. are based on the orientation or position relationships as shown in the drawings, for ease of the description of embodiments of the present disclosure and simplifying the description only, rather than indicating or implying that the indicated device or element must have a particular orientation or be constructed and operated in a particular orientation. Therefore, these terms should not be understood as a limitation to embodiments of the present disclosure. Furthermore, the terms such as "first", "second" and "third"

are merely for a descriptive purpose, and cannot be understood as indicating or implying a relative importance.

In the description of embodiments of the present disclosure, it should be understood that, unless otherwise specified and defined, the terms "install", "connected with", "connected to" should be comprehended in a broad sense. For example, these terms may be comprehended as that the components are fixedly connected, detachably connected or integrally connected, or that the components are mechanically connected or coupled, or that the components are directly connected or indirectly connected via an intermediate medium or in an internal communicating manner. The specific meanings about the foregoing terms in embodiments of the present disclosure may be understood by those skilled in the art according to specific circumstances.

In addition, the technical features involved in different embodiments of the present disclosure described above may be combined with each other as long as they do not constitute a conflict with each other.

Thus far, the technical solutions of embodiments of the present disclosure have been described in combination with the optional embodiments shown in the accompanying drawings. However, those skilled in the art may readily understand that the protection scope of the embodiments of the present disclosure is clearly not limited to these specific embodiments. Without departing from the principles of embodiments of the present disclosure, those skilled in the art may make equivalent changes or substitutions to the relevant technical features, and these changes or substitutions will fall within the protection scope of embodiments of the present disclosure.

What is claimed is:

1. A flexible display screen, comprising:
a flexible substrate provided with a foldable portion;
pixel units disposed on a first surface of the flexible substrate; and
a fold detection device comprising a reflective grating structure, an optical waveguide structure and a photoelectric sensor, wherein the optical waveguide structure and the reflective grating structure are sequentially laminated on the first surface of the flexible substrate and both disposed in the foldable portion, an orthographic projection of the optical waveguide structure onto the flexible substrate is overlapped with an orthographic projection of the reflective grating structure onto the flexible substrate, the optical waveguide structure is connected to the photoelectric sensor and comprises an isolation layer, a transparent conductive layer and a passivation layer laminated on the flexible substrate, and the isolation layer and the passivation layer have a smaller refractive index than the transparent conductive layer; and the reflective grating structure is disposed on the passivation layer, the passivation layer has a protruding structure stretching into the transparent conductive layer, and the protruding structure has an inclined surface at a specified angle to the flexible substrate, the specified angle being greater than 0 degree and less than 90 degrees.

2. The flexible display screen according to claim 1, wherein the isolation layer has a refractive index ranging from 1.1 to 1.3, the transparent conductive layer has a refractive index ranging from 1.5 to 2.1, and the passivation layer has a refractive index ranging from 1.1 to 1.3.

3. The flexible display screen according to claim 2, wherein materials of the isolation layer and the passivation layer comprise silicon oxide.

4. The flexible display screen according to claim 1, wherein the reflective grating structure comprises a plurality of grating grooves disposed on a side, distal from the transparent conductive layer, of the passivation layer, and a transparent conductive material disposed in the grating groove.

5. The flexible display screen according to claim 4, wherein the reflective grating structure has a flat surface on a side distal from the transparent conductive layer.

6. The flexible display screen according to claim 1, wherein materials of the transparent conductive layer comprise indium tin oxide.

7. The flexible display screen according to claim 1, wherein the optical waveguide structure is configured to transmit yellow light having a wavelength ranging from 580 nm to 610 nm.

8. The flexible display screen according to claim 1, wherein the fold detection device comprises a plurality of the reflective grating structures disposed in the foldable portion, and the plurality of the reflective grating structures is arranged in the foldable portion in ranks along at least two directions.

9. The flexible display screen according to claim 8, further comprising a control chip and a pixel driving circuit connected to the control chip, wherein the pixel driving circuit comprises a plurality of wires, an orthographic projection of the reflective grating structure onto the flexible substrate is within an orthographic projection of the wires onto the flexible substrate, and the wires comprise at least one of a gate line and a data line.

10. The flexible display screen according to claim 9, further comprising a control transistor, and a sub-screen disposed on both sides of the foldable portion, wherein the pixel driving circuit comprises a drive controlling line corresponding to the sub-screen, and the control transistor is connected to the drive controlling line and the gate line in the sub-screen corresponding to the drive controlling line, respectively.

11. The flexible display screen according to claim 1, further comprising a control chip disposed on the flexible substrate, and at least one ambient light detection array connected to the control chip, wherein the ambient light detection array comprises a plurality of detection transistors, a drain electrode of the detection transistor is connected to the control chip, and the control chip controls display of the flexible display screen in response to drain current of the detection transistor.

12. The flexible display screen according to claim 11, wherein the detection transistor is a low-temperature polycrystalline silicon thin film transistor.

13. The flexible display screen according to claim 11, further comprising an addressing thin film transistor for driving the pixel units, wherein the detection transistor shares a common gate electrode and a common source electrode with the addressing thin film transistor.

14. The flexible display screen according to claim 1, further comprising a control chip disposed on the flexible substrate, and an infrared light detection device comprising an infrared emitter and an infrared detection array, wherein the infrared detection array comprises a plurality of detection electrodes, the detection electrode comprises a metal layer and an electrode film layer disposed on the metal layer; the detection electrode is connected to the control chip; and the control chip controls display of the flexible display screen in response to feedback current of the detection electrode.

15. The flexible display screen according to claim 14, wherein a material of the electrode film layer comprises one of lithium niobate and lithium tantalate.

16. The flexible display screen according to claim 14, wherein the infrared emitter is disposed in the foldable portion; and
the flexible display screen further comprises a dummy pixel region, wherein the infrared detection array of the display screen is disposed in the dummy pixel region.

17. The flexible display screen according to claim 1, wherein the optical waveguide structure comprises an isolation layer, a transparent conductive layer and a passivation layer laminated on the flexible substrate; the isolation layer and the passivation layer have a smaller refractive index than the transparent conductive layer; the isolation layer has a refractive index ranging from 1.1 to 1.3, the transparent conductive layer has a refractive index ranging from 1.5 to 2.1, and the passivation layer has a refractive index ranging from 1.1 to 1.3; and materials of the isolation layer and the passivation layer comprise silicon oxide; and
the reflective grating structure is disposed on the passivation layer;
the optical waveguide structure is configured to transmit yellow light having a wavelength ranging from 580 nm to 610 nm; and
the passivation layer has a protruding structure stretching into the transparent conductive layer, and the protruding structure has an inclined surface at a specified angle to the flexible substrate, the specified angle being greater than 0 degree and less than 90 degrees.

18. An electronic device, comprising: a flexible display screen, wherein the flexible display screen comprises:
a flexible substrate provided with a foldable portion;
pixel units disposed on a first surface of the flexible substrate; and
a fold detection device, comprising a reflective grating structure, an optical waveguide structure and a photoelectric sensor, wherein the optical waveguide structure and the reflective grating structure are sequentially laminated on the first surface of the flexible substrate and both disposed in the foldable portion, an orthographic projection of the optical waveguide structure onto the flexible substrate is overlapped with an orthographic projection of the reflective grating structure onto the flexible substrate, the optical waveguide structure is connected to the photoelectric sensor and comprises an isolation layer, a transparent conductive layer and a passivation layer laminated on the flexible substrate, and the isolation layer and the passivation layer have a smaller refractive index than the transparent conductive layer; and the reflective grating structure is disposed on the passivation layer, the passivation layer has a protruding structure stretching into the transparent conductive layer, and the protruding structure has an inclined surface at a specified angle to the flexible substrate, the specified angle being greater than 0 degree and less than 90 degrees.

* * * * *